(12) United States Patent
Hur

(10) Patent No.: US 6,583,478 B2
(45) Date of Patent: Jun. 24, 2003

(54) TRANSFER CIRCUIT OF SEMICONDUCTOR DEVICE AND STRUCTURE THEREOF

(75) Inventor: Sung-Hoi Hur, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/948,201

(22) Filed: Sep. 6, 2001

(65) Prior Publication Data

US 2002/0121659 A1 Sep. 5, 2002

(30) Foreign Application Priority Data

Sep. 28, 2000 (KR) ........................................ 2000-57070

(51) Int. Cl.$^7$ .................... H01L 29/76; H01L 29/94; H01L 21/336
(52) U.S. Cl. .................. 257/366; 257/343; 438/201; 438/253; 438/257
(58) Field of Search ..................... 438/257, 201, 438/265, 396, 293, 176, 283; 257/314, 366, 326, 368, 412, 295, 343

(56) References Cited

U.S. PATENT DOCUMENTS 5,753,946 A * 5/1998 Naiki et al. ................. 257/295
6,329,874 B1 * 12/2001 Ye et al. ..................... 327/544

* cited by examiner

Primary Examiner—Matthew Smith
Assistant Examiner—Calvin Lee
(74) Attorney, Agent, or Firm—Marger Johnson & McCollom, P.C.

(57) ABSTRACT

A semiconductor transfer circuit and a structure thereof are provided. The transfer circuit and the structure thereof include a stack gate MOS transistor having first and second gate electrodes that are sequentially stacked and a control MOS transistor connected to the stack gate MOS transistor. A drain of the control MOS transistor is connected to the first gate electrode.

8 Claims, 3 Drawing Sheets

US 6,583,478 B2

TRANSFER CIRCUIT OF SEMICONDUCTOR DEVICE AND STRUCTURE THEREOF

This application relies for priority upon Korean Patent Application No. 2000-57070, filed on Sep. 28, 2000, the contents of which are herein incorporated by reference in their entirety.

FIELD OF THE INVENTION

The present invention generally relates to a circuit of a semiconductor device and a structure thereof. More specifically, the present invention is directed to a transfer circuit for transferring an electrical signal without voltage drop and a structure thereof.

BACKGROUND OF THE INVENTION

In order to transfer a data signal, semiconductor devices use an interconnection that is formed of a conductive layer. For example, data stored in a cell of a semiconductor memory device is read out by a sense amplifier, and an output signal of the sense amplifier is transferred to an input/output circuit through a data signal line such as a long bus line. In this case, a transfer circuit is widely used to control a signal that is transferred through the bus line. The transfer circuit has a pass transistor for transferring a signal applied to the bus line to the input/output circuit only for a required time. In other words, the output signal of the sense amplifier is transferred to the input/output circuit through a channel area of the pass transistor only while the pass transistor is turned on. An output signal of the transfer circuit is lower in voltage than that of the sense amplifier due to the pass transistor. Therefore, the input/output circuit can mistakenly operate by misrepresenting the data in the memory device.

To overcome such a problem of the transfer circuit, a transfer circuit having a boosting circuit has widely been applied to semiconductor devices.

FIG. 1 is a diagram of a conventional transfer circuit having a boosting circuit. The transfer circuit is composed of a pass transistor $T_P$, a control transistor $T_{CR}$ connected to a gate electrode of the pass transistor $T_P$, and a capacitive transistor $T_{CAP}$ connected to the gate electrode of the pass transistor $T_P$. Source and drain of the pass transistor $T_P$ correspond to input and output terminals of the transfer circuit, respectively. The gate electrode of the pass transistor $T_P$ is connected to a drain of the control transistor $T_{CR}$ and to a gate electrode of the capacitive transistor $T_{CAP}$. A source of the capacitive transistor $T_{CAP}$ is connected to a drain thereof. Thus, the capacitive transistor $T_{CAP}$ acts as a capacitor. In this case, the gate electrode of the pass transistor $T_P$ defines a boosting node BN.

An input signal $\emptyset i$ corresponding to a power supply voltage ($V_{CC}$) is applied to the source of the pass transistor $T_P$. First and second control signals $\emptyset_{CR1}$ and $\emptyset_{CR2}$ corresponding to a power supply voltage ($V_{CC}$) are applied to source and gate electrode of the control transistor $T_{CR}$, respectively. Thus, a voltage lower than the supply voltage $V_{CC}$ (i.e., a voltage corresponding to "$V_{CC}-Vt$") is induced to the boosting node BN. The "Vt" denotes a threshold voltage of the control transistor $T_{CR}$. If a third control signal $\emptyset_{CR3}$ corresponding to $V_{CC}$ is then applied to source/drain of the capacitive transistor $T_{CAP}$, a voltage $V_{BN}$ of the boosting node BN is boosted to be much higher than $V_{CC}$. Accordingly, the control transistor $T_{CR}$ is turned off to completely float the boosting node BN. A voltage much higher than a source voltage of the pass transistor $T_P$ is applied to the gate electrode thereof, inducing the same voltage as $V_{CC}$ to the drain thereof. That is, an input signal of the transfer circuit is transferred to an output terminal thereof without voltage loss.

According to such a prior art, a transmission efficiency of a signal can be maximized using a capacitive transistor $T_{CAP}$. Nonetheless, since a conventional transfer circuit is composed of three transistors, there is required a transfer circuit that is compact and is suitable for more highly-integrated semiconductor devices.

SUMMARY OF THE INVENTION

Therefore, an object of the invention is to provide a compact transfer circuit that is able to maximize a transmission efficiency and is suitable for highly-integrated semiconductor devices.

Another object of the invention is to provide a structure of a compact transfer circuit that is able to maximize a transmission efficiency and is suitable for highly-integrated semiconductor devices.

According to one aspect of the present invention, the invention includes a stack gate transistor that is connected to a data signal line and a control transistor that is connected to the stack gate transistor.

The stack gate transistor has a source that is connected to the data signal line, first and second gate electrodes that are sequentially stacked, and a drain for outputting an input signal that is applied to the source. The first gate electrode is connected to a drain of the control transistor. The source of the stack gate transistor corresponds to an input terminal of a transfer circuit to which a data signal is applied, and the drain thereof corresponds to an output terminal of the transfer circuit. Source and gate electrodes of the control transistor correspond to a first control terminal to which a first control signal is applied and a second control terminal to which a second control signal is applied, respectively. The second gate electrode corresponds to a third control terminal to which a third control signal is applied.

According to another aspect of the present invention, the invention includes a control transistor and a stack gate transistor that are formed on a semiconductor substrate. The control transistor is formed at a first active region that is defined on a predetermined area of the semiconductor substrate. The stack gate transistor is formed at a second active region that is adjacent to the first active region. The stack gate transistor has a first gate electrode crossing over the second active region, a second gate electrode being stacked on the first gate electrode, and source/drain regions formed at active regions which are located at either side of the first gate electrode. The control transistor has a gate electrode crossing over the first active region and source/drain regions being formed at active regions which are located at either side of the gate electrode. A drain region of the control transistor is electrically connected to the first gate electrode of the stack gate transistor through a local interconnection.

The first gate electrode includes an extension part that is not overlapped with the second gate electrode. Thus, one end of the local interconnection is connected to the extension part of the first gate electrode and the other end thereof is connected to the drain region of the control transistor. A first gate dielectric layer intervenes between the second active region and the first gate electrode, and a second gate dielectric layer (i.e., inter-gate dielectric layer) intervenes between the first gate electrode and the second gate electrode.

DESCRIPTION OF THE PREFERRED EMBODIMENT

Figure 1:
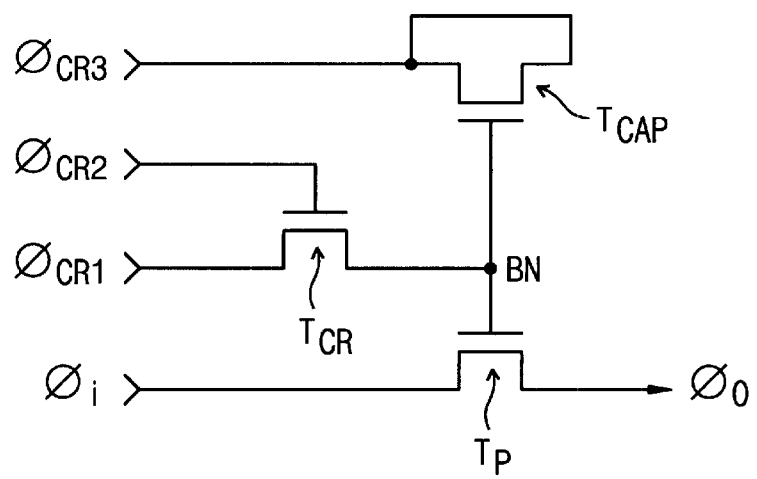
FIG. 1 is a diagram of a transfer circuit according to a prior art.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, some of the thicknesses of layers and regions are exaggerated for clarity, as will be understood by those of skill in the art. It will also be understood that when a layer is referred to as being "on" another layer or substrate, it can be directly on the other layer or substrate, or intervening layers may also be present. Like reference designators refer to like elements throughout.

Figure 2A:
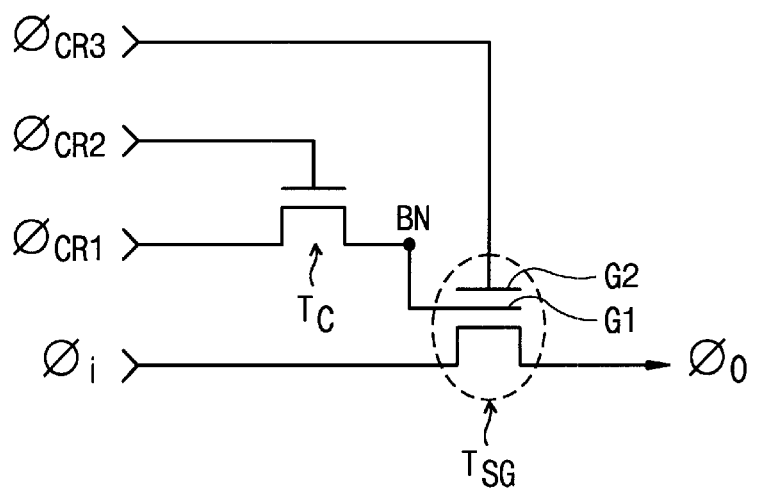
FIG. 2A is a diagram of a transfer circuit according to the present invention.

FIG. 2A is a diagram of a transfer circuit according to one embodiment of the present invention. A source region of a stack gate transistor $T_{SG}$ is connected to a data signal line, serving as an input terminal of the transfer circuit. The stack gate transistor $T_{SG}$ includes a first gate electrode G1 and a second gate electrode G2 that are sequentially stacked. Accordingly, the stack gate transistor $T_{SG}$ is turned on or off by a signal that is applied to the first gate electrode G1. In other words, an input signal $Ø_i$ applied to the source region of the stack gate transistor $T_{SG}$ is transferred to a drain region thereof or is cut off in accordance with the signal applied to the first gate electrode G1. Consequently, the drain region of the stack gate transistor $T_{SG}$ corresponds to an output terminal for outputting an output signal $Ø_0$ of the transfer circuit.

The first gate electrode G1 is connected to a drain region of a control transistor (e.g. a control MOS transistor) $T_C$. A source region of the control transistor $T_C$ corresponds to a first control terminal to which a first control signal $Ø_{CR1}$ is applied. A gate electrode of the control transistor $T_C$ corresponds to a second control terminal to which a second control signal $Ø_{CR2}$ is applied. The second gate electrode G2 corresponds to a third control terminal to which a third control signal $Ø_{CR3}$ is applied. In this case, the drain region (i.e., the first control electrode G1) of the control transistor $T_C$ corresponds to a boosting node BN of the conventional transfer circuit shown in FIG. 1.

Figure 2B:
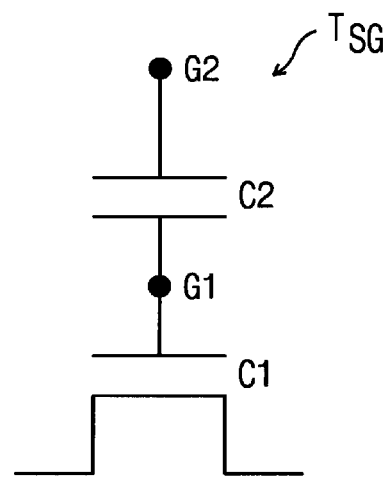
FIG. 2B is an equivalent circuit diagram of the stack gate transistor shown in FIG. 2A.

As may be seen from an equivalent circuit diagram in FIG. 2B, the stack gate transistor $T_{SG}$ is identical to a conventional flash memory cell transistor. In other words, a gate of the stack gate transistor $T_{SG}$ comprises two capacitors C1 and C2 that are serially connected to each other. There are a first capacitor C1 having a first capacitance between a channel region of the stack gate transistor $T_{SG}$ and the first gate electrode G1, and a second capacitor C2 having a second capacitance between the first and second electrodes G1 and G2. Consequently, a transfer circuit of the present invention is composed of two transistors.

Figure 3:
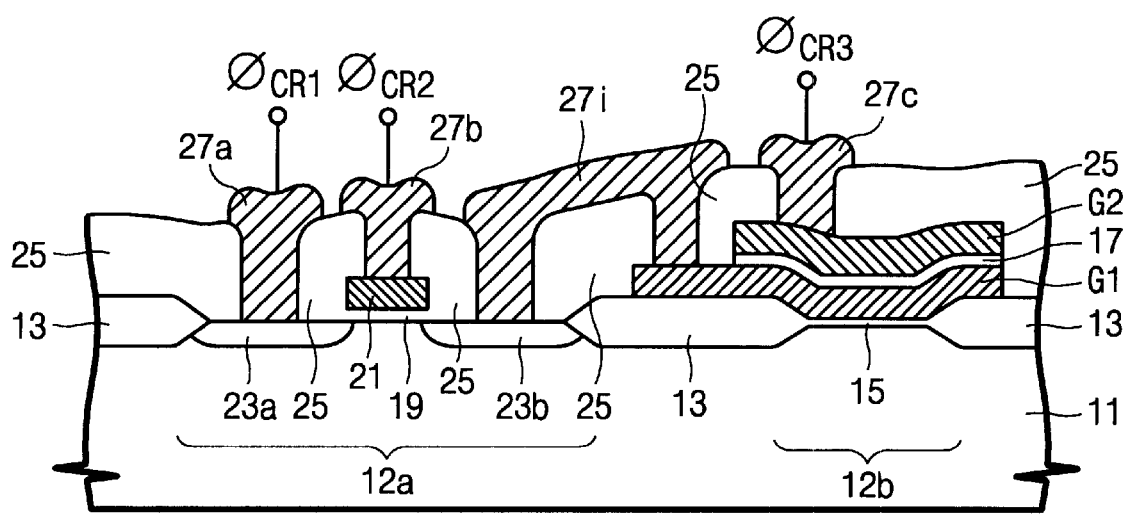
FIG. 3 is a cross-sectional diagram showing a structure of the transfer circuit, in which the transfer circuit shown in FIG. 2A is constructed on a semiconductor substrate.

FIG. 3 is a cross-sectional view showing a structure of a transfer circuit in accordance with the present invention. A device isolation layer 13 is formed on a semiconductor substrate 11 to define at least two active regions, e.g., first and second active regions respectively indicated at 12a and 12b. A predetermined region of the first active region 12a is covered with a gate electrode 21 disposed thereover. A source region 23a and a drain region 23b are formed at the first active 12a region located at either side of the gate electrode 21. A gate insulating layer 19 intervenes between the gate electrode 21 and the first active region, as shown. The gate electrode 21, the gate insulating layer 19, and the source/drain regions 23a and 23b constitute a control transistor $T_C$ (see FIG. 2A).

A predetermined region of the second active region 12b is covered with first and second gate electrodes G1 and G2 that are sequentially stacked. The first gate electrode G1 is disposed over the second active region 12b. Although not shown in the drawing, source and drain regions are formed at the second active region 12b located at either side of the first gate electrode G1. The first gate electrode G1 includes an extended region, or extension part, that is not covered by the second gate electrode G2, as shown in FIG. 3. A first gate dielectric layer (preferably, a tunnel oxide layer) 15 intervenes between the first gate electrode G1 and the second active region 12b. A second gate dielectric layer (i.e., an inter-gate dielectric layer) 17 intervenes between the first and second gate electrodes G1 and G2. In this case, the first and second gate electrodes G1 and G2, the first and second gate dielectric layers 15 and 17, and the source/drain regions located at either side of the first gate electrode G1 define a stack gate transistor $T_{SG}$ (see FIG. 2A). A construction of the stack gate transistor is identical to that of a conventional flash memory cell transistor. This makes it possible to apply a transfer circuit of this invention to a non-volatile memory device adopting a stack gate cell transistor without separate processes.

An entire surface of the semiconductor substrate including the control transistor and the stack gate transistor is covered with an interlayer insulating layer 25. A source region 23a of the control transistor is connected to a first control signal line 27a through a hole penetrating the interlayer insulating layer 25. The gate electrode 21 of the control transistor is connected to a second control signal line 27b through a hole penetrating the interlayer insulating layer 25. A drain region 23b of the control transistor is electrically connected to the extended region of the first gate electrode G1 through a local interconnection 27i penetrating the interlayer insulating layer 25. The second gate electrode G2 is connected to a third control signal line 27c through the hole penetrating the interlayer insulating layer 25.

Consequently, the source region 23a and the gate electrode 21 correspond to first and second control terminals, respectively. And the second gate electrode G2 corresponds to a third control terminal. Although not explicitly shown in FIG. 3, a source region of the stack gate transistor is connected to a data signal line through the hole penetrating the interlayer insulating layer 25. Therefore, the source and drain regions of the stack gate transistor correspond respectively to input and output terminals of the transfer circuit.

The first to third control signals $Ø_{CR1}$, $Ø_{CR2}$, and $Ø_{CR3}$ are applied to the first and third control terminals through the first and third control signal lines 27a, 27b, and 27c, respectively. The input signal $Ø_1$, (not explicitly shown in FIG. 3) is applied to the input terminal through the data signal line.

Figure 4:
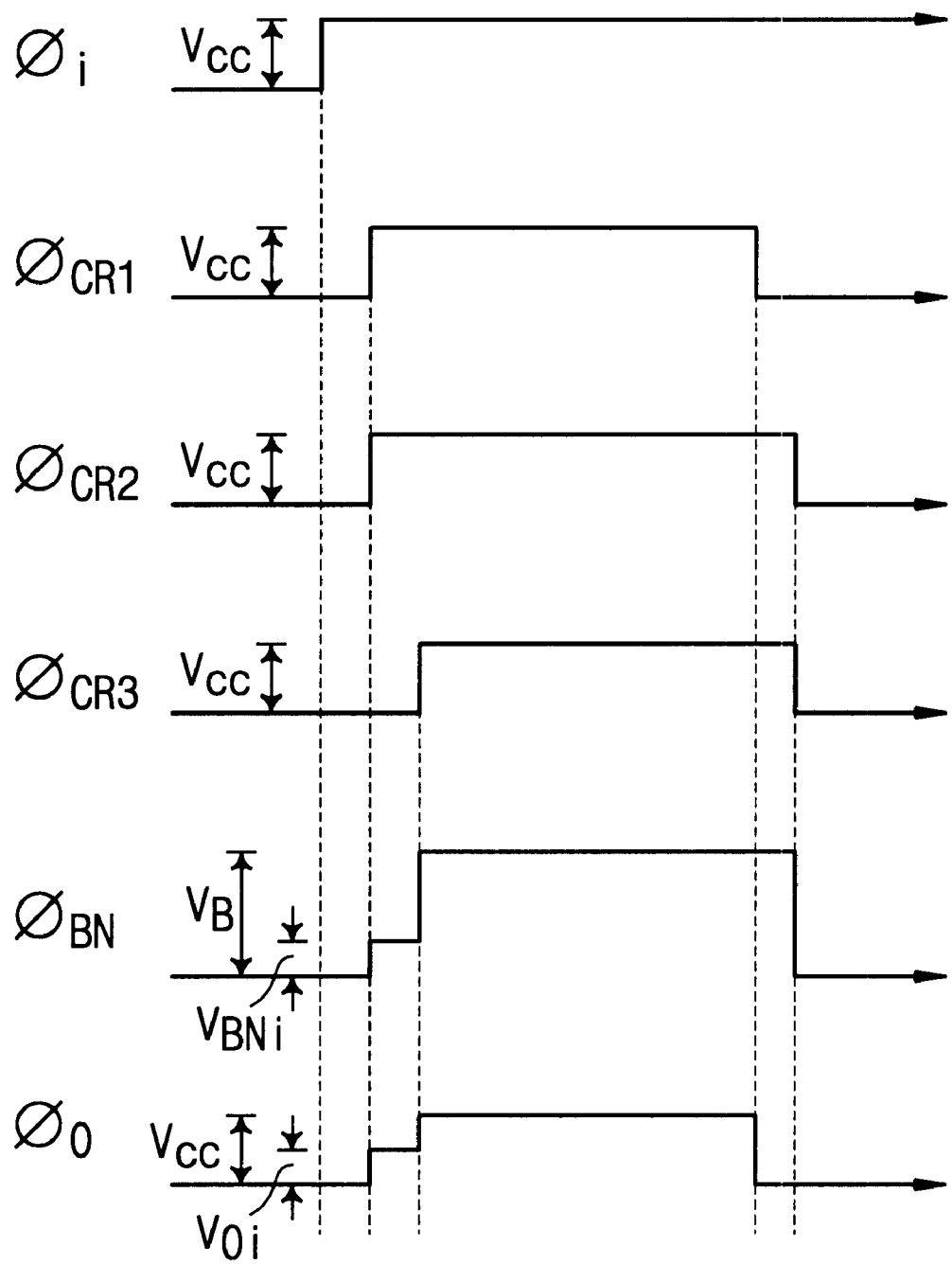
FIG. 4 is a waveform diagram for explaining operations of the transfer circuit shown in FIG. 2A.

FIG. 4 is a waveform diagram illustrating operations of the transfer circuit shown in FIG. 2A. An input signal $Ø_1$ corresponding to a power supply voltage $V_{CC}$ is applied to an input terminal (i.e., a source region of the stack gate transistor $T_{SG}$). If the first and second control signals $\emptyset_{CR1}$ and $\emptyset_{CR2}$ corresponding to $V_{CC}$ are then inputted to first and second control terminals respectively, an initial boosted voltage $V_{BNi}$ (i.e., $V_{CC}-V_{T1}$) lower than $V_{CC}$ is induced to the boosting node BN. Here, $V_{T1}$ denotes a threshold voltage of the control transistor $T_C$. Accordingly, an initial output voltage $V_{O1}$ lower than $V_{CC}-V_{T1}$ is induced in the drain region (i.e., output terminal) of the stack gate transistor $T_{SG}$.

If a third control signal $\emptyset_{CR3}$ corresponding to $V_{CC}$ is applied to the third control terminal, a final boosted voltage $V_B$ higher than the initial boosted voltage $V_{BNi}$ is induced in the boosting node BN. The final boosted voltage $V_B$ is expressed by the following equation.

$$V_B = V_{CC} - V_{T1} + \frac{C2}{C1+C2}V_{CC}$$

wherein $$\frac{C2}{C1+C2}$$

represents a so-called coupling ratio of the stack gate transistor $T_{SG}$.

Therefore, a voltage induced in the boosting node BN increases in proportion to the second capacitance C2. As a result, a boosted signal $\emptyset_{BN}$ having a voltage higher than $V_{CC}$ (preferably, $V_{CC}+V_{T2}$) can be obtained in proportion to the coupling ratio of the stack gate transistor $T_{SG}$. Here, $V_{T2}$ denotes a threshold voltage of the stack gate transistor $T_{SG}$ using the first gate electrode G1 as a gate electrode. Accordingly, when the first gate electrode G1 (i.e., boosting node BN) holds the boosting voltage $V_B$ higher than $V_{CC}+V_{T2}$, the output terminal has the same output signal $\emptyset_O$ as the input signal $\emptyset_1$. The final boosted voltage $V_B$ is retained at least until the first control signal $\emptyset_{CR1}$ ramps down to 0 volts.

As explained above, a pass transistor and a capacitive transistor are replaced with one stack gate transistor, constructing a slim transfer circuit that is composed of two transistors. Therefore, it is possible to maximize a transfer efficiency and to realize a compact transfer circuit that is suitable for highly-integrated semiconductor devices. In particular, a stack gate transistor can be formed together with a conventional flash memory cell transistor without separate processes. Accordingly, a transfer circuit of this invention can easily be applied to flash memory devices.

What is claimed is:

1. A transfer circuit of a semiconductor device having a substrate, the transfer circuit connected to a data signal line, the transfer circuit comprising:
   a stack gate MOS transistor having a source region that is connected to the data signal line, and first and second gate electrodes that are sequentially stacked; and
   a control MOS transistor having a drain region that is connected to the first gate electrode,
   the stack gate MOS transistor and the control MOS transistor being formed at first and second active regions that are laterally spaced apart from one another with device isolation layer patterns extending therebetween.

2. The transfer circuit of claim 1, wherein a source region and a gate electrode of the control MOS transistor respectively correspond to a first control terminal to which a first control signal is applied and a second control terminal to which a second control signal is applied, and wherein a source region, a drain region, and a second gate electrode of the stack gate MOS transistor respectively correspond to a data input terminal, a data output terminal, and a third control terminal.

3. A transfer circuit structure of a semiconductor device, comprising:
   a device isolation layer formed at a predetermined region of a semiconductor substrate, the device isolation layer defining first and second active regions;
   a control MOS transistor formed at the first active region;
   a stack gate MOS transistor having first and second gate electrodes that are sequentially stacked, the stack gate MOS transistor being formed at the second active region; and
   a local interconnection for electrically connecting a drain region of the control MOS transistor to the first gate electrode.

4. The transfer circuit structure of claim 3, wherein the first gate electrode includes an extension part that is not overlapped with the second gate electrode.

5. The transfer circuit structure of claim 4, wherein one end of the local interconnection is connected to the extension part of the first gate electrode and the other end thereof is connected to the drain region of the control MOS transistor.

6. The transfer circuit structure of claim 3, further comprising a tunnel oxide layer that intervenes between the first gate electrode and the second active region.

7. The transfer circuit structure of claim 3, further comprising an inter-gate dielectric layer that intervenes between the first and second gate electrodes.

8. The transfer circuit structure of claim 3, wherein the source region and the gate electrode of the control MOS transistor are respectively electrically connected to a first and a second control signal line, and wherein the second gate electrode is electrically connected to a third control signal line.

* * * * *

UNITED STATES PATENT AND TRADEMARK OFFICE
CERTIFICATE OF CORRECTION

PATENT NO. : 6,583,478 B2  
DATED : June 24, 2003  
INVENTOR(S) : Hur

It is certified that error appears in the above-identified patent and that said Letters Patent is hereby corrected as shown below:

<u>Column 5,</u>  
Line 9, "V01" should read -- VOi --.  
Line 37, "Ø1" should read -- Øi --.

Signed and Sealed this

Sixteenth Day of September, 2003

JAMES E. ROGAN  
*Director of the United States Patent and Trademark Office*